Nov. 29, 1966 B. H. PINCKAERS 3,289,067

SEMICONDUCTOR SINE WAVE INVERTER

Filed Sept. 23, 1963 3 Sheets-Sheet 1

INVENTOR.
BALTHASAR H. PINCKAERS
BY
Omund R. Dahle
ATTORNEY

Nov. 29, 1966 B. H. PINCKAERS 3,289,067

SEMICONDUCTOR SINE WAVE INVERTER

Filed Sept. 23, 1963 3 Sheets-Sheet 2

INVENTOR.

BALTHASAR H. PINCKAERS

BY

Omund R. Dahle

ATTORNEY

INVENTOR.
BALTHASAR H. PINCKAERS
BY
Omund R. Dahle
ATTORNEY

United States Patent Office 3,289,067

Patented Nov. 29, 1966

3,289,067

SEMICONDUCTOR SINE WAVE INVERTER

Balthasar H. Pinckaers, Edina, Minn., assignor to Honeywell Inc., a corporation of Delaware Filed Sept. 23, 1963, Ser. No. 310,529

25 Claims. (Cl. 321—2)

This invention is concerned with semiconductor power supply apparatus, and more particularly with improved sine wave inverter apparatus, which includes transistor devices and magnetic core devices for the improvement of wave shape output over a wide range of load conditions.

Sine wave inverters or oscillators are well known in the art. One of the major difficulties with presently known static sine wave oscillators is the distortion of the output wave form with a varying load. Generally, circuits of the type in question are designed to work at one specific load, or at the most, must be reset each time there is a major variance in the load. This invention is novel in the ability of this since wave oscillator to produce a virtually undistorted sine wave under load conditions varying from no load to maximum load.

An object of this invention is to provide a sine wave inverter capable of producing an undistorted sine wave shape under no load to maximum load conditions.

A further object of this invention is to provide an inverter capable of undistorted full wave rectified output under conditions of no load to maximum load.

Figure 1:
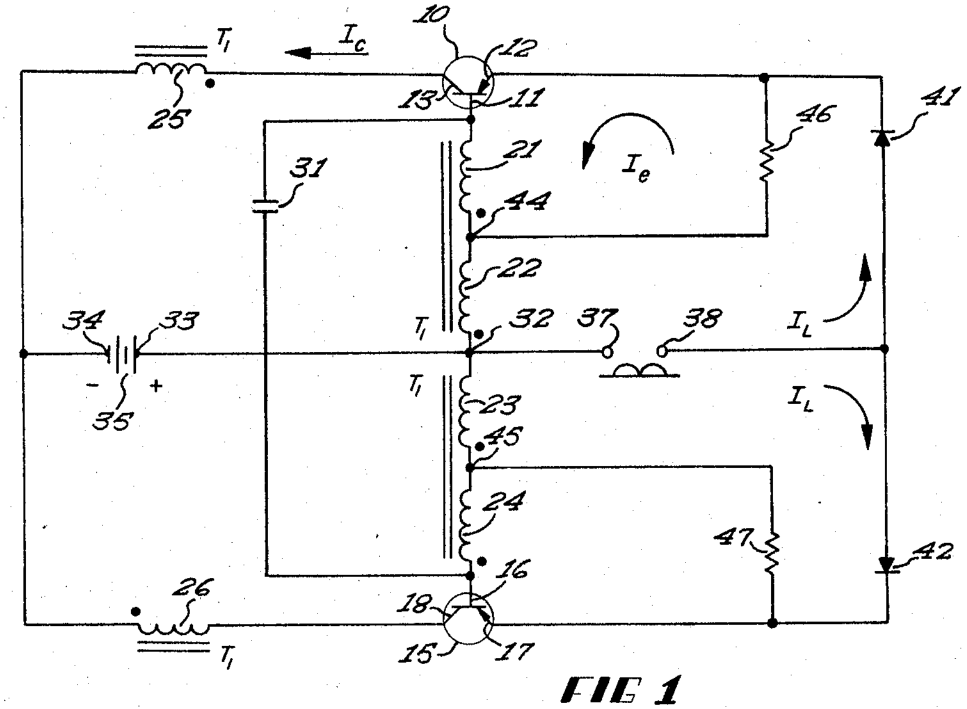
Figure 2:
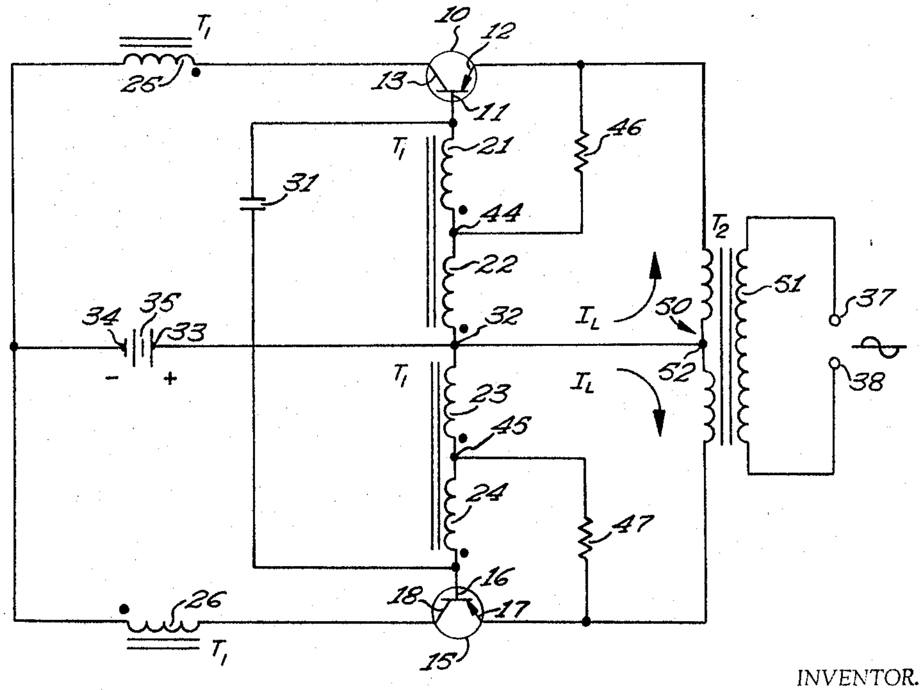
Figure 3:
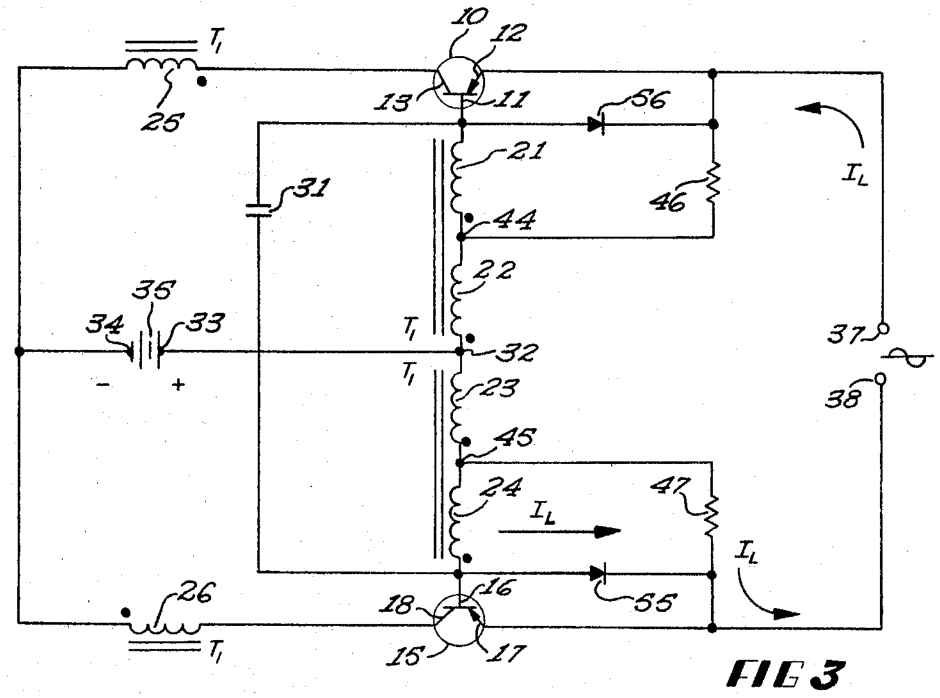
Figure 4:
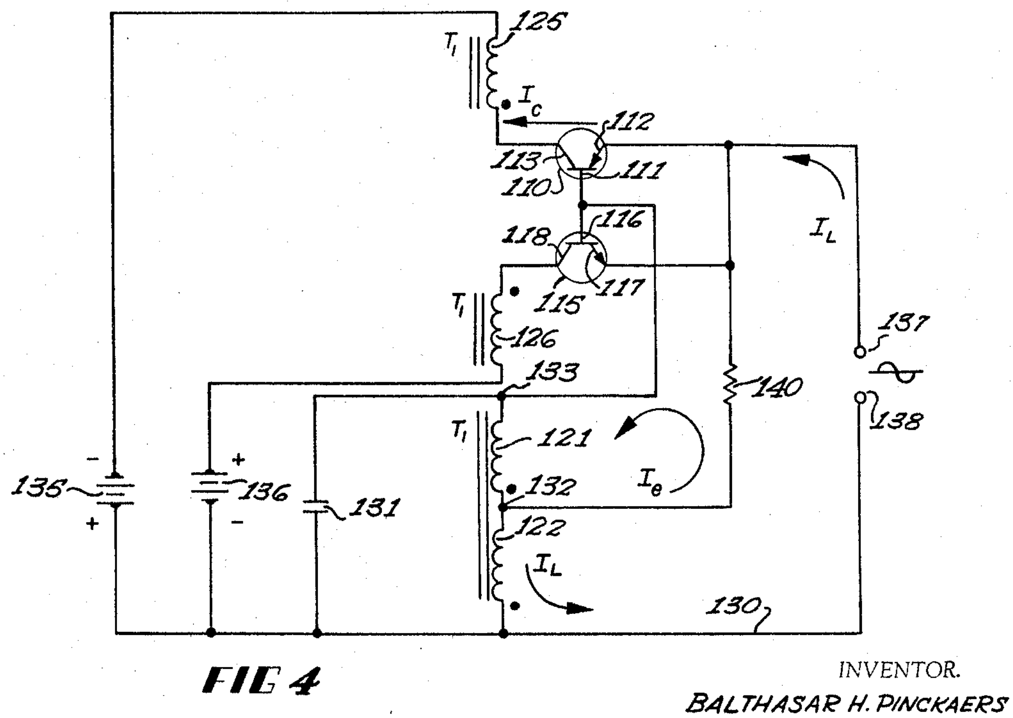
Figure 5:
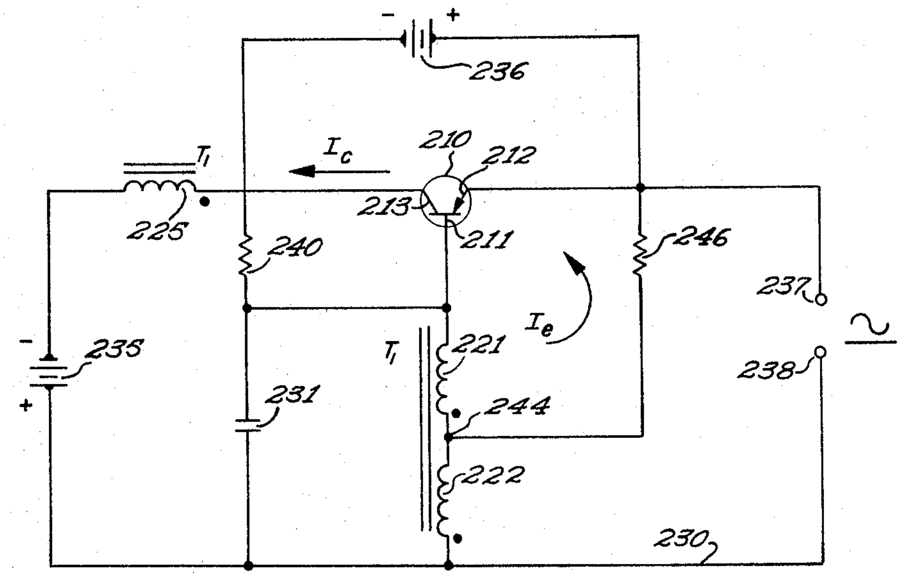
Figure 6:
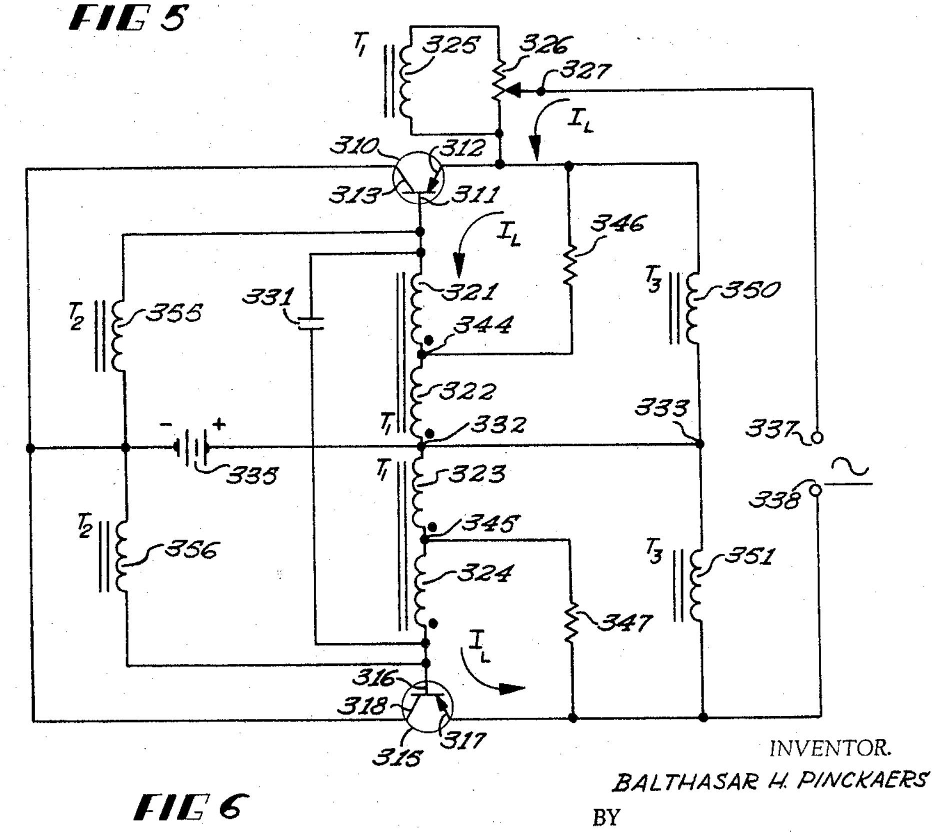

These and other objects of the invention will become apparent upon consideration of the accompanying claims, specification and drawing, of which:

FIGURE 1 is a schematic diagram of an embodiment of the invention for a full wave rectified output, FIGURE 2 is another schematic diagram of an embodiment of the invention for full wave output, FIGURE 3 is a schematic diagram showing a variation in the circuit of FIGURES 1 and 2, FIGURE 4 is yet another representation of an embodiment of the invention for full wave output, FIGURE 5 is a schematic representation of an embodiment of the invention for Class A full wave output, and FIGURE 6 is another schematic representation of a Class A full wave output embodiment of the invention.

Referring now to FIGURE 1 there is disclosed a pair of semiconductor amplifying means 10 and 15 shown as PNP junction transistors. Transistor 10 has an emitter electrode 12, a collector electrode 13, and a base electrode 11. Transistor 15 has an emitter electrode 17, a collector electrode 18, and a base electrode 16. There is also shown a transformer T1 having six windings 21, 22, 23, 24, 25 and 26, all wound on a single common magnetic core. Windings 21, 22, 23 and 24 are serially connected between base electrode 11 and base electrode 16. Winding 24 has the same number of turns as winding 21, winding 23 the same number of turns as winding 22, and winding 26 has the same number of turns as winding 25. A capacitor 31 is also connected from base electrode 11 to base electrode 16, thus connected in parallel with windings 21, 22, 23 and 24, forming a resonant tank circuit. A junction 32 is connected to a terminal 33 of a source of unidirectional potential, here shown as a battery 35. Another terminal 34 of battery 35 is connected through winding 25 to collector electrode 13 and through winding 26 to collector electrode 18. Junction 32 is also connected to an output terminal 37. Emitter electrode 12 is connected through a diode 41 to an output terminal 38. Emitter 17 is connected through a diode 42 to output terminal 38. Emitter electrode 12 is also connected through a feedback resistor 46 to a junction 44. Emitter electrode 17 is also connected through a feedback resistor 47 to a junction 45.

*Operation of FIGURE 1*

Assume now that the resonant circuit has been charged and is resonating in a direction such that all the serially connected windings 21, 22, 23 and 24 will be positive at their dotted end, and negative at the other end. These polarities appearing at the bases 11 and 16 will tend to turn on transistor 10 while tending to turn off transistor 15. Assuming at first no load operation, there arises the problem of losses in a resonant circuit which are well known to those versed in the art. In order to sustain the oscillation or resonating of the resonant circuit the losses must somehow be replaced. For the purposes of this application the losses in the magnetization of the core will be defined as a loss of magnetic potential.

With the flow of current in the resonant circuit as described above, winding 21 will act as a small source of voltage, thus causing a current flow through resistor 46, emitter 12 to base 11, and back through winding 21. This current will in turn cause another, slightly lower, current flow from base 11 to collector 13 of transistor 10, through windings 25 to the source of potential 35, thence through windings 22 and 21, and back to base 11. This latter current will flow through windings 21, 22 and 25 in such a direction to be additive to the magnetic potential on the core. Since it has already been stated that the object is to balance out the magnetic potential losses, we can now look at the necessary formulas. The demagnetizing ampere-turns, herein called lost magnetic potential, is equal to $(Ie)x$ (turns in winding 21). The magnetizing ampere-turns, herein called additive magnetic potential, is equal to $(Ic)x$ (turns in winding 21+winding 22+winding 25). To sustain no load oscillation the additive magnetic potential must be slightly greater than the lost magnetic potential. Therefore feedback resistor 46 is chosen of a value such that $$Ie(21) < Ic(21+22+25)$$

Now assume that a load is attached to output terminals 37 and 48. Now the load current will be $I_L$. Again assuming that the circuit is operative and current is in the direction as originally described above, load current will flow from junction 32, through the load, through diode 41, from emitter 12 to base 11 of transistor 10, and back through windings 21 and 22 to junction 32. Due to transistor action this causes a slightly smaller current flow from base 11 to collector 13 of transistor 10, through winding 25 to the source of potential 35, thence through windings 22 and 21, and back to base 11. This current through windings 21, 22 and 25 will restore the magnetic potential of the core of transformer T1. The additional current into emitter 12 is $I_L$, therefore the additional current out of collector 13 may be called alpha $I_L$, where alpha ($\alpha$) is the current gain of a common base transistorm amplifier, as is well known in the art. To sustain the oscillation it is necessary that $$\alpha I_L(21+22+25) \geqslant I_L(21+22)$$

Equating and cancelling $I_L$ we see that our equation for sustenance of oscillation under load is:

$$\alpha(21+22+25) \geqslant (21+22)$$

Since $I_L$ does not appear in the formula for sustenance of oscillation, the formula will be valid for the full range of minimum to maximum load. Note that $\alpha$ of a junction type transistor is always less than but close to unity, a typical value is .98, therefore small changes in $\alpha$ due to loading and temperature have only minor effect on the generated sine wave shape. Further note that as described above, only transistor 10 is operating during the first half-cycle of the tank circuit. After the tank circuit has completed one half-cycle, transistor 10 will be off, and transistor 15 will then operate in the same manner as transistor 10 above. Since essentially each transistor is off for one half-cycle, this is termed Class B operation, and with the diode rectified output this will result in a D.C. full wave rectified output.

Referring now to FIGURE 2, the schematic shown is a variation of the schematic of FIGURE 1, and the construction is as described in FIGURE 1 with the exception that the diodes 41 and 42 are replaced by a transformer T2 having a center-tapped primary winding 50 and a secondary winding 51. The output terminals 37 and 38 are now connected at the ends of secondary windings 51. Junction 32 is now connected to a center-tap 52 of primary winding 50, one end of primary winding 50 is connected to emitter 12, and the other end of primary winding 50 is connected to emitter 17.

*Operation of FIGURE 2*

The operation of the circuit of FIGURE 2 is the same as described for FIGURE 1 with the exception that the load current $I_L$ will now flow from junction 32 through junction 52 and the upper half of primary winding 50, through the emitter 12 and base 11 of transistor 10, and through windings 21 and 22 back to junction 32. The condition for sustenance of oscillation under load is again $$\alpha(21+22+25)\geqq(21+22)$$

The use of ouput transformer T2 will provide an A.C. sine wave output at terminals 37 and 38.

Referring now to FIGURE 3, the schematic shown is a variation of the full wave output circuit of FIGURE 2, and the construction is as described above with the exception that the output transformer T2 is removed, output terminal 37 is directly connected to emitter 12, output terminal 38 is directly connected to emitter 17, a diode 55 is connected from base 16 to emitter 17, and a diode 56 is connected from base 11 to emitter 12.

*Operation of FIGURE 3*

The operation of FIGURE 3 is similar to that of FIGURES 1 and 2 for no load operation. For loaded operation, again assuming that resonant circuit is charged and current flowing as described above, the load current $I_L$ will now flow from junction 32 through windings 23 and 24, through diode 55, through the load, from emitter 12 to base 11 of transistor 10, and through windings 21 and 22 back to junction 32. This will again induce a collector current $\alpha I_L$ which will flow from junction 32, through windings 22 and 21, from base 11 to collector 13 of transistor 10, through winding 25, through battery 35 and back to junction 32. Thus the lost magnetic potential will be equal to $I_L(21+22+23+24)$, and the additive magnetic potential will be equal to $\alpha I_L(21+22+25)$. If winding 21+22 contain the same number of turns as windings 23+24, by equating the two quantities, the formula for sustenance of oscillation under load of FIGURE 3 can be seen to be, $$\alpha(21+22+25)=2(21+22)$$

Referring now to FIGURE 4 there is disclosed a full sine wave output inverter circuit utilizing a pair of semiconductor amplifying means of the opposite conductivity type, here shown as PNP and NPN junction transistors 110 and 115. Transistor 110 has an emitter electrode 112, a collector electrode 113 and a base electrode 111. Transistor 115 has an emitter electrode 117, a collector electrode 118 and a base electrode 116. There is also shown a transformer $T_1$ having four windings 121, 122, 125 and 126, all wound on a single common magnetic core. Windings 121 and 122 are serially connected between a junction 133 and a lead 130. A capacitor 131 is also connected between junction 133 and lead 130, thus connected in parallel with windings 121 and 122, forming a resonant tank circuit. Junction 133 is connected to base electrodes 111 and 116. An output terminal 137 is connected to emitter electrodes 112 and 117. A feedback resistor 140 is connected from emitter electrodes 112 and 117 to a junction 32 between serially connected windings 121 and 122. Collector 113 is connected to one end of winding 125, and the other end of winding 125 being connected to a negative terminal of a source of unidirectional potential, here shown as a battery 135. A positive terminal of battery 135 is connected to lead 130. Collector 118 is connected to one end of winding 126, the other end of winding 126 is connected to a positive terminal of a second source of unidirectional potential, here shown as a battery 136. A negative terminal of battery 136 is connected to lead 130. A second output terminal 138 is connected to lead 130.

*Operation of FIGURE 4*

As in the previously described FIGURES 1, 2 and 3, the aim of this circuit is to sustain oscillation by restoring lost magnetic potential. Assuming the resonant tank circuit has been charged, and is resonating such that the dotted ends of windings 121 and 122 are positive and the other ends are negative, it can be seen that the resulting voltage on base electrodes 111 and 116 will tend to turn on PNP transistor 110, while tending to turn off NPN transistor 115. Winding 121 will act as a small source of potential causing a current, $I_e$, to flow from junction 132 through feedback resistor 140, from emitter 112 to base 111 of transistor 110, thence to junction 133 and back through winding 121 to junction 132. This will be a demagnetizing potential with an ampere-turns value equal to $(I_e)x$ (number of turns in winding 121). $I_e$ will induce a current, $I_c$, in transistor 110 which will flow from base 111 to collector 113 of transistor 110, through winding 125 to the negative terminal of battery 135, from the positive terminal of battery 135 through windings 122 and 121 to junction 133, and back to base 111. This will be a magnetizing potential with an ampere-turns value equal to $(I_c)x$ (number of turns in windings 121+122+125). Feedback resistor 140 and windings 121, 122 and 125 are chosen such that $$I_c(121+122+123)>I_e(121)$$

in order to sustain oscillation under no load conditions. Note that during the second half-cycle of resonation transistor 110 will be off while transistor 115 will be on, and the current flow will be analogous to the above description.

Now turning to load operation of FIGURE 4, assuming the original voltage-current relationships as in the no-load description above, it can be seen that a load current, $I_L$, will flow from the dotted end of winding 122 through the load, from emitter 112 to base 111 of transistor 110, thence to junction 133 and back through windings 121 and 122. This will cause lost magnetic potential equal to $I_L$ (121+122). A current will be induced in transistor 110 which will be equal to $\alpha I_L$. This current will flow from junction 133, from base 111 to collector 113 of transistor 110, through winding 125 to the negative terminal of battery 135, from the positive terminal of battery 135 back through windings 122 and 121 to junction 133. This will cause an additive magnetic potential equal to $\alpha I_L(121+122+125)$. By choosing the proper number of turns for winding 125 such that $$\alpha(121+122+125)\geqq 121+122$$

the oscillation under load conditions will be sustained.

It would be well in this discussion of FIGURE 4 to review the aims of the circuits in general, with particular reference to this FIGURE 4. As for the previously described circuits of FIGURES 1, 2 and 3, one aim is to cause the circuit to oscillate with no load present. A further aim is to enable the circuit to continue to oscillate upon application of an external load. Moreover, it is the general aim that in either condition, with or without an external load, the generated wave is substantially a sine wave with little distortion. A small amount of distortion must be accepted, due to a small amount of overdrive which prevents the oscillation from being unstable. It is the fundamental object of these circuits to force the drive or input to the resonant tank circuit to be just enough to supply the losses. If the drive is more than necessary, wave shape distortion results, and if the drive is not enough, the oscillation stops.

Referring again to FIGURE 4, even with no load connected to output terminals 137 and 138 there are internal losses in the inverter. Therefore, even then, some input to the resonant circuit is needed to sustain oscillation. The no load feedback is accomplished by resistor 140. Since this resistor itself constitutes a load on the system it must be taken into account.

Assume now that the circuit is oscillating with no external load present. If now an external load is connected to terminals 137 and 138, a load current $I_L$ will flow. This load current is an additional load on the resonant tank circuit and as far as the transistors 10 and 15 are concerned, this current $I_L$ adds to the no load emitter current, $I_e$, already present. Due to transistor action the additional emitter current $I_L$ causes an increase in collector current equal to $\alpha I_L$. It can be seen that $I_L$ flows through windings 121 and 122 in one direction, while $\alpha I_L$, the collector current increase, flows through windings 121 and 122 in the opposite direction. This already causes almost complete cancellation of the load ampere-turns on the core of transformer T1, but cancellation is not complete because $\alpha$ is less than 1 for a junction transistor. Therefore $\alpha I_L$, collector current increase, is made to flow further through a small winding 125 (or 126) such that:

$$\alpha I_L(121+122+125) \geqslant I_L(121+122)$$

or that $$\alpha(121+122+125) \geqslant (121+122)$$

therefore $$125 \geqslant (1-\alpha)/\alpha(121+122)$$

which condition, if met, will cause complete cancellation of the load (demagnetizing) ampere-turns. It can be seen that the number of turns in winding 125 must increase with decreasing $\alpha$. Therefore the number of turns in winding 125 is selected for the lowest value of $\alpha$ that can be expected for a given transistor type.

Thus far the unknown winding 125 has been determined in terms of an independent variable (winding 121 plus winding 122) which depends on the oscillator frequency, maximum output power, and regulation. By so determining winding 125 it is assured that when an external load is connected, which is equal to or smaller than the maximum rated load, the oscillation will be sustained with an increase in drive to the tank circuit which is as low as possible, and therefore preserve the wave shape as previously explained. Now having determined the number turns in winding 125 (and 126), which must also be present in the circuit when adjusting no load drive, though then not necessary for operation, there must also be a determination or resistor 140 and winding 121. Note that the sum of the windings 121 and 122 is known. It is sufficient to say that resistor 140 and winding 121 are chosen and adjusted such that the no load oscillation is just sustained with minimum overdrive and therefore little wave shape distortion. There is no one unique value for resistor 140 and winding 121, since there are many combinations of resistor 140 and winding 121 which will work satisfactory.

Referring now to FIGURE 5 there is disclosed a schematic of a class A, full wave output, sine wave inverter utilizing a single semiconductor amplifying means, here shown as a junction transistor 210. Transistor 210 has an emitter electrode 212, a collector electrode 213 and a base electrode 211. There is also disclosed a transformer T1 having three windings 221, 222 and 225, all wound on a single common magnetic core. Windings 221 and 222 are serially connected from base 211 of transistor 210 to a lead 230. A capacitor 231 is also connected from base 211 to lead 230, thus connected in parallel with windings 221 and 222, forming a resonant tank circuit. Winding 225 is connected from collector 213 of transistor 210 to a negative terminal of a source of unidirectional potential, here shown as a battery 235. A positive terminal of battery 235 is connected to lead 230. Emitter 212 of transistor 210 is connected to an output terminal 237. Emitter 212 is also connected through a feedback resistor 246 to a junction 244. Emitter 212 is further connected to a positive terminal of a second source of unidirectional potential, here shown as a battery 236. A biasing resistor 240 is connected from a negative terminal of battery 236 to base 211. Lead 230 is connected to an output terminal 238.

*Operation of FIGURE 5*

The current flow for analysis of the no-load condition for sustenance of oscillation in FIGURE 5 is analogous to the previous explanations. The resulting formula will again be $$I_c(221+222+225) > I_e(221)$$

if the proper values are chosen for feedback resistor 246 and winding 225. However, since bias resistor 240 and battery 236 are chosen such that transistor 210 is biased Class A, transistor 210 will be always on, and current flow through transistor 210 will be increased and decreased by the resonating of the resonant tank circuit.

The same is true for load operation, when the formula for oscillation will be $$\alpha(221+222+225) \geqq 221+222$$

However, since transistor 210 is biased Class A, the output wave form appearing across output terminals 237 and 238 will be a sine wave cycling above a small positive potential.

Referring now to FIGURE 6 there is disclosed another schematic of a Class A, full wave output, sine wave inverter utilizing a pair of semiconductor amplifying means, here shown as transistors 310 and 315. Transistors 310 has an emitter electrode 312, a collector electrode 313 and a base electrode 311. Transistor 315 has an emitter electrode 317, a collector electrode 318 and a base electrode 316. There is also disclosed a first transformer T1 having five windings 321, 322, 323, 324 and 325 all wound on a single common magnetic core. Windings 321, 322, 323 and 324 are serially connected from base 311 to base 316. A capacitor 331 is also connected from base 311 to base 316, thus connected in parallel with serially connected windings 321, 322, 323 and 324, forming a resonant tank circuit. A second transformer T2 has a pair of windings 355 and 356 used to bias transistors 310 and 315 in a Class A mode. Winding 355 is connected from base 311 of transistor 310 to a negative terminal on a source of unidirectional potential, here shown as a battery 335. Winding 356 is connected from base 316 of transistor 315 to the negative terminal on battery 335. A positive terminal of battery 335 is connected to a junction 332. A third transformer T3 has a pair of windings 350 and 351 serially connected from emitter 312 of transistor 310 to emitter 317 of transistor 315. Junction 332 is connected to a junction 333 between serially connected windings 350 and 351. Collector 313 of transistor 310 and collector 318 of transistor 315 are connected to the negative terminal of battery 335. A feedback resistor 346 is connected from a junction 344 between windings 321 and 322 to emitter 312. A second feedback resistor 347 is connected from a junction 345 between windings 323 and 324 to emitter 317. A feedback potentiometer 326, having a wiper arm 327, has one end connected to emitter 312, while wiper arm 327 is connected to an output terminal 337. Winding 325 of transformer T1 is connected in parallel with potentiometer 326. And an output terminal 338 is connected to emitter 317.

*Operation of FIGURE 6*

The derivation of the formula for no load sustenance of oscillation is analogous to those previously described, with the exception that there is no winding in the collector circuits of either transistor 310 or 315. As a result, the no load formula becomes $$I_e(321)<I_c(321+322)$$

For load operation, again assuming resonant circuit charge and current flow in the direction previously assumed, both transistors 310 and 315 will be biased on, due to the effect of biasing windings 355 and 356, however, on the first half-cycle transistor 310 will tend to conduct stronger than transistor 315 due to the effect of the voltage drop in the resonant tank circuit. A loader current, $I_L$, will flow from junction 332 through windings 323 and 324, from base 316 to emitter 317 of transistor 315, from output terminal 338 through the load to output terminal 337, through wiper arm 327 and a selected portion of potentiometer 326, from emitter 312 to base 311 of transistor 310, and through windings 321 and 322 back to junction 332. If windings 321 and 324, and 322 and 323, are equal in all respects, the lost magnetic potential will be equal to $I_L 2(321+322)$. The current flow through a portion of potentiometer 326 will induce a voltage on winding 325. Assuming a proportion P of voltage drop due to $I_L$, the additive magnetic potential will be $I_L P(325)$ plus the effect on collector current of transistor 310 equal to $\alpha I_L(321+322)$. Equating the losses and gains the formula for sustenance of oscillation under load conditions becomes $$P(325)=(2-\alpha)(321+322)$$

It will be obvious that the general principles herein disclosed may be embodied in many other embodiments widely different from those illustrated, without departing from the spirit of the invention as defined in the following claims.

I claim as my invention:

1. Sine wave inverter apparatus comprising: resonant circuit means, including a number of serially connected inductance means wound on a common magnetic core; current amplifying means; further inductance means wound on said common magnetic core; a source of potential; said current amplifying means connected intermediate said resonant circuit means and said further inductance means; said source of potential connected intermediate said further inductance means and said resonant circuit means; said connections made such that current from the output of said amplifying means must flow through further inductance means in a direction to create an additive magnetic potential in said common magnetic core, thus restoring magnetic potential lost in the resonating of said resonant circuit means; feedback means, said feedback means connected intermediate said resonant circuit means and said current amplifying means, such as to cause a current flow in said amplifying means even under no load conditions; and output means connected intermediate said amplifying means and said resonant circuit.

2. Sine wave inverter apparatus comprising: semiconductor amplifying means having input, output and control electrodes; resonant circuit means, said resonant circuit means including a number of serially connected inductance means wound on a common magnetic core; first and second output terminals; said resonant circuit connected intermediate said first output terminal and said control electrode, such that as said resonant circuit resonates it will control the current flow through said semiconductor amplifying means; further inductance means wound on said common magnetic core; a first source of unidirectional potential; said further inductance means connected intermediate said output electrode and a first polarity of said first source of potential, such that all output current from said semiconductor amplifying means must flow through said further inductance means in a direction to create an additive magnetic potential in said common magnetic core, thus restoring magnetic potential lost in the resonating of said resonant circuit means; feedback means, for providing bias to said semiconductor amplifying means, said feedback means connected intermediate said input electrode and said resonant circuit means; a second source of unidirectional potential; biasing means for biasing said semiconductor amplifying means in a class "A" mode, said biasing means connected intermediate said control electrode and a first polarity of said second source of potential; connecting means connecting a second polarity of said second source of potential and said second output terminal to said input electrode; and further connecting means connecting a second polarity of said first source of potential to said first output terminal.

3. Sine wave inverter apparatus comprising; semiconductor amplifying means having input, output and control electrodes; transformer means, said transformer means including a plurality of windings on a common magnetic core; resonant circuit means, said resonant circuit means including a number of said transformer windings serially connected; first and second output terminals; said resonant circuit connected intermediate said first output terminal and said control electrode, such that as said resonant circuit resonates it will control the current flow through said semiconductor amplifying means; a first source of unidirectional potential; means including further windings of said transformer plurality of windings connected intermediate said output electrode and a first polarity of said first source of potential, such that all output current from said semiconductor amplifying means must flow through said further windings in a direction to create an additive magnetic potential in said common magnetic core, thus restoring magnetic potential lost in the resonating of said resonant circuit means; feedback means, for providing forward bias to said semiconductor amplifying means, said feedback means connected intermediate said input electrode and a point on said resonant circuit number of transformer windings; a second source of unidirectional potential; biasing means, for biasing said semiconductor amplifying means in a Class A mode, said biasing means connected intermediate said control electrode and a first polarity of said second source of potential; connecting means connecting a second polarity of said second source of potential and said second output terminal to said input electrode; and further connecting means connecting a second polarity of said first source of potential to said first output terminal.

4. Sine wave inverter apparatus comprising: semiconductor amplifying means having input, output and control electrodes; transformer means, said transformer means including first, second and third windings on a common magnetic core, said first and second windings being similar to each other in all respects; resonant circuit means, said resonant circuit means including said first and second windings serially connected; first and second output terminals; said resonant circuit connected intermediate said first output terminal and said control electrode, such that as said resonant circuit resonates it will control the current flow through said semiconductor amplifying means; a first source of unidirectional potential; said third winding connected intermediate said output electrode and a first polarity of said first source of potential, such that all output current from said semiconductor amplifying means must flow through said third winding in a direction to create an additive magnetic potential in said common magnetic core, thus restoring magnetic potential lost in the resonating of said resonant circuit means; feedback means, for providing forward bias to said semiconductor amplifying means, said feedback means connected intermediate said input electrode and a point on said serially connected first and second windings; a second source of unidirectional potential; biasing means, for biasing said semiconductor amplifying means in a Class A mode, said biasing means connected intermediate said control electrode and a first polarity of said second source of potential; connecting means connecting a second polarity of said second source of potential and said second output terminal to said input electrode; and further connecting means connecting a second polarity of said first source of potential to said first output terminal.

5. Sine wave inverter apparatus comprising: a transistor having emitter, collector and base electrodes; transformer means, said transformer means including first, second and third windings on a common magnetic core, said first and second windings being similar to each other in all respects; first and second output terminals; said first and second windings serially connected intermediate said first output terminal and said base electrode; a capacitor, said capacitor connected in parallel with said serially connected first and second windings, such that said capacitor and said first and second windings form a resonant tank circuit; a first source of unidirectional potential; said third winding connected intermediate said collector electrode and a first polarity of said first source of potential, such that all collector current from said transistor must flow through said third winding in a direction to create an additive magnetic potential in said common magnetic core, thus restoring magnetic potential lost in the resonating of said resonant circuit; a feedback resistor, for providing bias to said transistors, said feedback resistor connected intermediate said emitter electrode and a point on said serially connected first and second windings; a second source of unidirectional potential; a biasing resistor, for biasing said transistor in a Class A mode, said biasing resistor connected intermediate said base electrode and a first polarity of said second source of potential; connecting means connecting a second polarity of said second source of potential and said second output terminal to said emitter electrode; and further connecting means connecting a second polarity of said first source of potential to said first output terminal.

6. Sine wave inverter apparatus comprising: a pair of semiconductor amplifying means having input, output and control electrodes; resonant circuit means, said resonant circuit means including a number of serially connected inductance means wound on a common magnetic core, said resonant circuit means connected intermediate said control electrodes, such that as said resonant circuit means resonates it will alternately increase and decrease the flow of current through each of said semiconductor amplifying means; a source of unidirectional potential; further inductance means connected intermediate a first of said output electrodes and a first polarity of said source of potential; still further inductance means connected intermediate the second of said output electrodes and said first polarity of said source of potential; said further and still further inductance means being wound on said common magnetic core, and connected in such a manner that current through said further and still further inductance means will create an additive magnetic potential in said common magnetic core, thus restoring magnetic potential lost in the resonating of said resonant circuit means; means connecting a second polarity of said source of potential to said resonant circuit, first and second feedback means, for providing forward bias to said pair of semiconductor amplifying means; said first feedback means connected intermediate said resonant circuit means and a first of said input electrodes; said second feedback means connected intermediate said resonant circuit means and the second of said input electrodes; output means, said output means connected intermediate said input electrodes; and means connecting said resonant circuit means to said output means.

7. Sine wave inverter apparatus comprising: a pair of semiconductor amplifying means having input, output and control electrodes; first transformer means, said first transformer means including a plurality of windings on a common magnetic core; resonant circuit means, said resonant circuit means including a number of said first transformer windings serially connected, said resonant circuit means connected intermediate said control electrodes; a source of unidirectional potential; means including further windings of said first transformer windings connecting each of said output electrodes to a first polarity of said source of potential, such that all output current from said semiconductor amplifying means must flow through at least one of said further windings in such a direction to create an additive magnetic potential in said common magnetic core, thus restoring magnetic potential lost in said resonant circuit means; output transformer means, said output transformer means including a center-tapped primary winding and a secondary winding; means connecting said center-tap and a center point of said resonant circuit number of windings to a second polarity of said source of potential; said output transformer primary winding connected intermediate said input electrodes; first and second feedback means, for providing bias to said pair of semiconductor amplifying means; said first feedback means connected intermediate a first point on at least one of said resonant circuit number of windings and a first of said input electrodes; said second feedback means connected intermediate a second point on at least one of said resonant circuit number of windings and the second of said input electrodes; a pair of output terminals; and means connecting said output transformer secondary winding intermediate said output terminals.

8. Sine wave inverter apparatus comprising: a pair of semiconductor amplifying means having input, output and control electrodes; first transformer means, said first transformer means including a first, second and third pair of windings on a common magnetic core, said first and second pair of windings being similar to each other in all respects; resonant circuit means, said resonant circuit means including said first and second pair of windings serially connected, said resonant circuit means connected intermediate said control electrodes; a source of unidirectional potential; a first of said third pair of windings connected intermediate a first of said output electrodes and a first polarity of said source of potential; the second of said third pair of windings connected intermediate the second of said output electrodes and said first polarity of said source of potential; said third pair of windings thus connected such that all output current from said pair of semiconductor amplifying means must flow through at least one of said third pair of windings in such a direction to create an additive magnetic potential in said common magnetic core, thus restoring magnetic potential lost in said resonant circuit means; output transformer means, said output transformer means including a center-tapped primary winding and a secondary winding; means connecting said center-tap of said primary winding to a second polarity of said source of potential; means connecting said center-tap of said primary winding to a center point between said serially connected first and second pair of windings; said output transformer primary winding connected intermediate said input electrodes; first and second feedback means, for providing bias to said pair of semiconductor amplifying means; said first feedback means connected intermediate a point on said first pair of windings and a first of said input electrodes; said second feedback means connected intermediate a point on said second pair of windings and the second of said input electrodes; a pair of output terminals; and means connecting said output transformer secondary winding intermediate said output terminals.

9. Sine wave inverter apparatus comprising: a pair of transistors having emitter, collector and base electrodes; first transformer means, said first transformer means including a first, second and third pair of windings on a common magnetic core, said first and second pair of windings being similar to each other in all respects, said first and second pair of windings serially connected intermediate said base electrodes; a capacitor, said capacitor connected in parallel with said serially connected first and second pair of windings, such that said capacitor, and said first and second pair of windings form a resonant tank circuit; a source of unidirectional potential; a first of said third pair of windings connected intermediate a first of said collector electrodes and a first polarity of said source of potential; the second of said third pair of windings connected intermediate the second of said collector electrodes and said first polarity of said source of potential; said third pair of windings thus connected such that all collector current from said pair of transistors must flow through at least one of said third pair of windings in such a direction to create an additive magnetic potential in said common magnetic core, thus restoring magnetic potential lost in said resonant circuit; output transformer means, said output transformer means including a center-tapped primary winding and a secondary winding; means connecting said center-tap of said primary winding to a second polarity of said source of potential and to a center point between said serially connected first and second pair of windings; said output transformer primary winding connected intermediate said emitter electrodes; first and second feedback resistors, for providing bias to said pair of transistors; said first feedback resistor connected intermediate a point on said first pair of windings and a first of said emitter electrodes; said second feedback resistor connected intermediate a point on said second pair of windings and the second of said emitter electrodes; a pair of output terminals; and said output transformer secondary winding connected intermediate said output terminals.

10. Sine wave inverter apparatus comprising: a pair of semiconductor amplifying means having input, output and control electrodes; resonant circuit means, said resonant circuit means including a number of serially connected inductance means wound in a common magnetic core, said resonant circuit means connected intermediate said control electrodes, such that as said resonant circuit means resonates it will alternately increase and decrease the flow of current through each of said semiconductor amplifying means; a source of unidirectional potential; further inductance means connected intermediate a first of said output electrodes and a first polarity of said source of potential; still further inductance means connected intermediate the second of said output electrodes and said first polarity of said source of potential; said further and still further inductance means being wound on said common magnetic core, and connected in such a manner that current through said further and still further inductance means will create an additive magnetic potential in said common magnetic core, thus restoring magnetic potential lost in said resonant circuit means; means connecting a second polarity of said source of potential to said resonant circuit; first and second feedback means, for providing bias to said pair of semiconductor amplifying means; said first feedback means connected intermediate said resonant circuit means and a first of said input electrodes; said second feedback means connected intermediate said resonant circuit means and the second of said input electrodes; rectifying means connected intermediate said input electrodes; and output means connected intermediate said rectifying means and said resonant circuit means.

11. Sine wave inverter apparatus comprising: a pair of semiconductor amplifying means having input, output and control electrodes; transformer means, said transformer means including a plurality of windings on a common magnetic core; resonant circuit means, said resonant circuit means including a number of said transformer windings serially connected, said resonant circuit means connected intermediate said control electrodes; a source of unidirectional potential; means including further windings of said transformer windings connecting each of said output electrodes to a first polarity of said source of potential, such that all output current from said semiconductor amplifying means must flow through at least one of said further windings in such a direction to create an additive magnetic potential in said common magnetic core, thus restoring magnetic potential lost in said resonant circuit means; means connecting a point on said resonant circuit number of windings to a second polarity of said source of potential; a pair of output terminals; means connecting a first of said output terminals to said point on said resonant circuit number of windings; rectifying means connected intermediate the second of said output terminals and each of said input electrodes; first and second feedback means, for providing bias to said pair of semiconductor amplifying means; said first feedback means connected intermediate a first point on at least one of said resonant circuit numbers of windings and a first of said input electrodes; and said second feedback means connected intermediate a second point on at least one of said resonant circuit number of windings and the second of said input electrodes.

12. Sine wave inverter apparatus comprising: a pair of semiconductor amplifying means having input, output and control electrodes; transformer means, said transformer means including a first, second and third pair of windings on a common magnetic core, said first and second pair of windings being similar to each other in all respects; resonant circuit means, said resonant circuit means including said first and second pair of windings serially connected, said resonant circuit means connected intermediate said control electrodes; a source of unidirectional potential; a first of said third pair of windings connected intermediate a first of said output electrodes and a first polarity of said source of potential; the second of said third pair of windings connected intermediate the second of said output electrodes and said first polarity of said source of potential; said third pair of windings thus connected so that all output current from said pair of semiconductor amplifying means must flow through at least one of said third pair of windings in such a direction to create an additive magnetic potential in said common magnetic core, thus restoring magnetic potential lost in said resonant circuit means; means connecting a point on said serially connected first and second pair of windings to a second polarity of said source of potential; a pair of output terminals; means connecting a first of said output terminals to said point on said serially connected first and second pair of windings; rectifying means connected intermediate the second of said output terminals and each of said input electrodes; first and second feedback means, for providing bias to said pair of semiconductor amplifying means; said first feedback means connected intermediate a point on said first pair of windings and a first input electrode; and means connecting said second feedback means intermediate a point on said second pair of windings and the second input electrode.

13. Sine wave inverter apparatus comprising: a pair of transistors having emitter, collector and base electrodes; transformer means, said transformer means including a first, second and third pair of windings on a common magnetic core, said first and second pair of windings being similar to each other in all respects, said first and second pair of windings serially connected intermediate said base electrodes; a capacitor, said capacitor connected in parallel with said serially connected first and second pair of windings so as to form a resonant tank circuit; a source of unidirectional potential; a first of said third pair of windings connected intermediate a first of said collector electrodes and a first polarity of said source of potential; the second of said third pair of windings connected intermediate the second of said collector electrodes and said first polarity of said source of potential; said third pair of windings thus connected so that all collector current from said pair of transistors must flow through at least one of said third pair of windings in such a direction to create an additive magnetic potential in said common magnetic core, thus restoring magnetic potential lost in said resonant circuit; means connecting a point on said serially connected first and second pair of windings to a second polarity of said source of potential; a pair of output terminals; means connecting a first of said output terminals to said point on said serially connected first and second pair of windings; a first diode connected intermediate the second of said output terminals and a first of said emitter electrodes; a second diode connected intermediate the second of said output terminals and the second of said emitter electrodes; first and second feedback resistors, for providing bias to said pair of transistors; said first feedback resistor connected intermediate a point on said first pair of windings and said first emitter electrode; and said second feedback resistor connected intermediate a point on said second pair of windings and said second emitter electrode.

14. Sine wave inverter apparatus comprising: a pair of semiconductor amplifying means having input, output and control electrodes; resonant circuit means, said resonant circuit means including a number of serially connected inductance means wound on a common magnetic core, said resonant circuit means connected intermediate said control electrodes, such that as said resonant circuit means resonates it will alternately increase and decrease the flow of current through each of said semiconductor amplifying means; a source of unidirectional potential; further inductance means connected intermediate a first of said output electrodes and a first polarity of said source of potential; still further inductance means connected intermediate the second of said output electrodes and said first polarity of said source of potential; said further and still further inductance means being wound on said common magnetic core, and connected in such a manner that current through said further and still further inductance means will create an additive magnetic potential in said common magnetic core, thus restoring magnetic potential lost in said resonant circuit means; means connecting a second polarity of said source of potential to said resonant circuit; first and second feedback means, for providing bias to said pair of semiconductor amplifying means; said first feedback means connected intermediate said resonant circuit means and a first of said input electrodes; said second feedback means connected intermediate said resonant circuit means and the second of said input electrodes; output means connected intermediate said input electrodes; first and second asymmetric semiconductor means; said first asymmetric means connected intermediate a first of said control electrodes and said first input electrode; and said second asymmetric means connected intermediate the second of said control electrodes and said second input electrode.

15. Sine wave inverter apparatus comprising: a pair of semiconductor amplifying means having input, output and control electrodes; transformer means, said transformer means including a plurality of windings on a common magnetic core, resonant circuit means, said resonant circuit means including a number of said transformer windings serially connected, said resonant circuit means connected intermediate said control electrodes; a source of unidirectional potential; means including further windings of said transformer windings connecting each of said output electrodes to a first polarity of said source of potential, such that all output current from said semiconductor amplifying means must flow through at least one of said further windings in such a direction to create an additive magnetic potential in said common magnetic core, thus restoring magnetic potential lost in said resonant circuit means; means connecting a point on said resonant circuit number of windings to a second polarity of said source of potential; first and second feedback means, for providing bias to said pair of semiconductor amplifying means; said first feedback means connected intermediate a first point on at least one of said resonant circuit number of windings and a first of said input electrodes; said second feedback means connected intermediate a second point on at least one of said resonant circuit number of windings and the second of said input electrodes; output means connected intermediate said input electrodes; first and second asymmetric semiconductor means; said first asymmetric means connected intermediate a first of said control electrodes and said first input electrode; and said second asymmetric means connected intermediate the second of said control electrodes and said second input electrode.

16. Sine wave inverter apparatus comprising: a pair of semiconductor amplifying means having input, output and control electrodes; transformer means, said transformer means including a first, second and third pair of windings on a common magnetic core, said first and second pair of windings being similar to each other in all respects; resonant circuit means, said resonant circuit means including said first and second pair of windings serially connected, said resonant circuit means connected intermediate said control electrodes; a source of unidirectional potential; a first of said third pair of windings connected intermediate a first of said output electrodes and a first polarity of said source of potential; the second of said third pair of windings connected intermediate the second of said output electrodes and said first polarity of said source of potential; said third pair of windings thus connected so that all output current from said pair of semiconductor amplifying means must flow through at least one of said third pair of windings in such a direction to create an additive magnetic potential in said common magnetic core, thus restoring magnetic potential lost in said resonant circuit means; means connecting a center point between said serially connected first and second pair of windings to a second polarity of said source of potential; first and second feedback means, for providing forward bias to said pair of semiconductor amplifying means; said first feedback means connected intermediate a center point between said first pair of windings and a first of said input electrodes; said second feedback means connected intermediate a center point between said second pair of windings and the second of said input electrodes; output means connected intermediate said input electrodes; first and second asymmetric semiconductor means; said first asymmetric means connected intermediate a first of said control electrodes and said first input electrode; and said second asymmetric means connected intermediate the second of said control electrodes and said second input electrode.

17. Sine wave inverter apparatus comprising: a pair of transistors having emitter, collector and base electrodes; transformer means, said transformer means including a first, second and third pair of windings on a common magnetic core, said first and second pair of windings being similar to each other in all respects, said first and second pair of windings serially connected intermediate said base electrodes; a capacitor, said capacitor connected in parallel with said serially connected first and second pair of windings such as to form a resonant tank circuit; a source of unidirectional potential; a first of said third pair of windings connected intermediate a first of said collector electrodes and a first polarity of said source of potential; the second of said third pair of windings connected intermediate the second of said collector electrodes and said first polarity of said source of potential; said third pair of windings thus connected so that all collector current from said pair of transistors must flow through at least one of said third pair of windings in such a direction to create an additive magnetic potential in said common magnetic core, thus restoring magnetic potential lost in said resonant circuit; means connecting a point on said serially connected first and second pair of windings to a second polarity of said source of potential; first and second feedback means for providing bias to said pair of transistors; said first feedback means connected intermediate a point on said first pair of windings and a first of said pair of emitter electrodes; said second feedback resistor connected intermediate a point on said second pair of windings and the second of said emitter electrodes; output means connected intermediate said emitter electrodes; first and second diodes; said first diode connected intermediate a first of said base electrodes and said first emitter electrode; said second diode connected intermediate the second of said base electrodes and said second emitter electrode; said first and second diodes connected in a polarity to form a backward current bypass for the emitter-base junction of said first and second transistors.

18. Sine wave inverter apparatus comprising: a pair of semiconductor amplifying means having input, output and control electrodes; resonant circuit means, said resonant circuit means including a number of serially connected inductance means having a common magnetic core; first and second output terminals; said resonant circuit means connected intermediate said first output terminal and said control electrodes, such that as said resonant circuit means resonates it will alternately increase and decrease the flow of current through each of said semiconductor amplifying means; a first source of unidirectional potential; means connecting a first polarity of said first source of potential to said first output terminal; further inductance means, said further inductance means connected intermediate a first of said output electrodes and a second polarity of said first source of potential; a second source of unidirectional potential; means connecting a first polarity of said second source of potential to said first output terminal; still further inductance means, said still further inductance means connected intermediate the second of said output electrodes and a second polarity of said second source of potential; said further and still further inductance means being wound on said common magnetic core, and connected in such a manner that current through said further and still further inductance means will create an additive magnetic potential in said common magnetic core, thus restoring magnetic potential lost in said resonant circuit means; feedback means for providing a bias to said pair of semiconductor amplifying means; said feedback means connected intermediate said resonant circuit and said input electrodes; and means connecting said input electrodes to said second output terminal.

19. Sine wave inverter apparatus comprising: a pair of semiconductor amplifying means having input, output and control electrodes; transformer means, said transformer means including a plurality of windings on a common magnetic core; resonant circuit means, said resonant circuit means including a number of said transformer windings serially connected; first and second output terminals; said resonant circuit means connected intermediate said first output terminal and said control electrodes, such that as said resonant circuit means resonates it will alternately increase and decrease the flow of current through each of said semiconductor amplifying means; a first source of unidirectional potential; means connecting a first polarity of said first source of potential to said first output terminal; means including further windings of said transformer windings connecting a first of said output electrodes to a second polarity of said first source of potential; a second source of unidirectional potential; means connecting a first polarity of said second source of potential to said first output terminal; means including still further windings of said transformer windings connecting the second of said output electrodes to a second polarity of said second source of potential; said further and still further windings being wound on said common magnetic core, and connected in such a manner that current through said further and still further windings will create an additive magnetic potential in said common magnetic core, thus restoring magnetic potential lost in said resonant circuit means; feedback means for providing a bias to said pair of semiconductor amplifying means, said feedback means connected intermediate said resonant circuit and said input electrodes; and connecting means connecting said input electrodes to said second output terminal.

20. Since wave inverter apparatus comprising: a pair of semiconductor amplifying means having input, output and control electrodes; transformer means, said transformer means including a first and second pair of windings on a common magnetic core; resonant circuit means, said resonant circuit means including said first pair of windings serially connected; first and second output terminals; said resonant circuit means connected intermediate said first output terminal and said control electrodes, such that as said resonant circuit means resonates it will alternately increase and decrease the flow of current through each of said semiconductor amplifying means; a first source of unidirectional potential; means connecting a first polarity of said first source of potential to said first output terminal; a first of said second pair of windings connected intermediate a first of said output electrodes and a second polarity of said first source of potential; a second source of unidirectional potential; means connecting a first polarity of said second source of potential to said first output terminal; the second of said second pair of windings connected intermediate the second of said output electrodes and a second polarity of said second source of potential; said second pair of windings being wound on said common magnetic core, and connected in such a manner that current through said second pair of windings will create an additive magnetic potential in said common magnetic core, thus restoring magnetic potential lost in said resonant circuit means; feedback means for providing a bias to said pair of semiconductor amplifying means, said feedback means connected intermediate a center point between said first pair of windings and said input electrodes; and connecting means connecting said input electrodes to said second output terminal.

21. Sine wave inverter apparatus comprising: a pair of transistors having emitter, collector and base electrodes; transformer means, said transformer means including a first and second pair of windings on a common magnetic core, said first pair of windings serially connected intermediate said base electrodes; a capacitor, said capacitor connected in parallel wtih said first pair of windings thus forming a resonant tank circuit; first and second output terminals; a first source of unidirectional potential; means connecting a first polarity of said first source of potential to said first output terminal; a first of said second pair of windings connected intermediate a first of said collector electrodes and a second polarity of said first source of potential; a second source of unidirectional potential; means connecting a first polarity of said second source of potential to said first output terminal; the second of said second pair of windings connected intermediate the second of said collector electrodes and a second polarity of said second source of potential; said second pair of windings being wound on said common magnetic core, and connected in such a manner that current through said second pair of windings will create an additive magnetic potential in said common magnetic core, thus restoring magnetic potential lost in said resonant circuit; a feedback resistor, for providing bias to said pair of transistors; said feedback resistor connected intermediate a point on said first pair of windings and said emitter electrodes; and means connecting said emitter electrodes to said second output terminal.

22. Sine wave inverter apparatus comprising: a pair of semiconductor amplifying means having input, output and control electrodes; resonant circuit means, said resonant circuit means including a number of serially connected inductance means wound on a common magnetic core, said resonant circuit means connected intermediate said control electrodes, such that as said resonant circuit means resonates it will alternately increase and decrease the flow of current through each of said semiconductor amplifying means; a source of unidirectional potential; means connecting a point on said number of serially connected inductance means to a first polarity of said source of potential; connecting means connecting said output electrodes to a second polarity of said source of potential; biasing means, for biasing said semiconductor amplifying means in a class "A" mode, said biasing means connected intermediate said second polarity of said source of potential and each of said control electrodes; first and second feedback means, for providing bias to said semiconductor amplifying means; said first feedback means connected intermediate said resonant circuit and a first of said input electrodes; said second feedback means connected intermediate said resonant circuit and the second of said input electrodes; further inductance means, said further inductance means connected intermediate said first polarity of said source of potential and each of said input electrodes; first and second output terminals; said first output terminal connected to said second input electrode; and output feedback means, including still further inductance means wound on said common magnetic core, said output feedback means connected intermediate said second output terminal and said first input electrode, such that current flowing through said output feedback means will create an additive magnetic potential in said common magnetic core, thus restoring magnetic potential lost in said resonant circuit means.

23. Sine wave inverter apparatus comprising: a pair of semiconductor amplifying means having input, output and control electrodes; first transformer means, said first transformer means including a plurality of windings on a common magnetic core; resonant circuit means, said resonant circuit means including a number of said first transformer windings serially connected, said resonant circuit means connected intermediate said control electrodes; a source of unidirectional potential; means connecting a point on said number of serially connected first transformer windings to a first polarity of said source of potential; connecting means connecting said output electrodes to a second polarity of said source potential; second transformer means, for biasing said semiconductor amplifying means in a Class A mode, said second transformer means connected intermediate said second polarity of said source of potential and each of said control electrodes; first and second feedback means, for providing bias to said semiconductor amplifying means; said first feedback means connected intermediate said resonant circuit and a first of said input electrodes; said second feedback means connected intermediate said resonant circuit and the second of said input electrodes; third transformer means, said third transformer means connected intermediate said first polarity of said source of potential and each of said input electrodes; first and second output terminals; said first output terminal connected to said second input terminal; and output feedback means, including further windings of said first transformer wound on said common magnetic core, said output feedback means connected intermediate said second output terminal and said first input electrode, such that current flowing through said output feedback means will create an additive magnetic potential in said common magnetic core, thus restoring magnetic potential lost in said resonant circuit means.

24. Sine wave inverter apparatus comprising: a pair of semiconductor amplifying means having input, output and control electrodes; first transformer means, said first transformer means including a first and second pair of windings on a common magnetic core, said first and second pair of windings being similar to each other in all respects, said first transformer also including an independent winding also on said common magnetic core; resonant circuit means, said resonant circuit means including said first and second pair of windings serially connected, said resonant circuit means connected intermediate said control electrodes; a source of unidirectional potential; means connecting a center point between said serially connected first and second pair of windings to a first polarity of said source of potential; connecting means connecting said output electrodes to a second polarity of said source of potential; second transformer means, including first and second windings; said first winding connected intermediate said second polarity of said source of potential and a first of said output electrodes; said second windings connected intermediate said second polarity of said source of potential and the second of said output electrodes; said second transformer first and second windings thus connected to provide a Class A bias for said semiconductor amplifying means; first and second feedback means, for providing bias to said semiconductor amplifying means; said first feedback means connected intermediate said resonant circuit and a first of said input electrodes; said second feedback means connected intermediate said resonant circuit and the second of said input electrodes; third transformer means, said third transformer means connected intermediate said first polarity of said source of potential and each of said input electrodes; first and second output terminals, said first output terminal connected to said second input electrode; and output feedback means, including said first transformer means independent winding, said output feedback means connected intermediate said second output terminal and said first input electrodes, such that current flowing through said output feedback means will create an additive magnetic potential in said common magnetic core, thus restoring magnetic potential lost in resonant circuit means.

25. Sine wave inverter apparatus comprising: a pair of transistors having emitter, collector and base electrodes; first transformer means, said first transformer means including a first and second pair of windings on a common magnetic core, said first and second pair of windings being similar to each other in all respects, said first transformer means also including an independent winding on said common magnetic core; said first and second pair of windings serially connected intermediate said base electrodes; a capacitor, said capacitor connected in parallel with said serially connected first and second pair of windings, such that said capacitor and said first and second pair of windings form a resonant tank circuit; a source of unidirectional potential; means connecting a center point between said serially connected first and second pair of windings to a first polarity of said source of potential; connecting means connecting said collector electrodes to a second polarity of said source of potential; second transformer means, including first and second windings for biasing said transistors in a Class A mode; said first winding connected intermediate said second polarity of said source of potential and a first of said base electrodes; said second winding connected intermediate said second polarity of said source of potential and the second of said base electrodes; first and second feedback means, for providing bias to said transistors; said first feedback means, connected intermediate said resonant circuit and a first of said emitter electrodes; said second feedback means connected intermediate said resonant circuit and the second of said emitter electrodes; third transformer means, said third transformer means connected intermediate said first polarity of said source of potential and each of said emitter electrodes; first and second output terminals; said first output terminal connected to said second emitter electrode; and output feedback means, including said first transformer means independent winding, said output feedback means connected intermediate said second output terminal and said first emitter electrode, such that current flowing through said output feedback means will create an additive magnetic potential in said common magnetic core, thus restoring magnetic potential lost in said resonant tank circuit.

No references cited.

JOHN F. COUCH, *Primary Examiner.*

W. H. BEHA, *Assistant Examiner.*